(12) United States Patent
Lin et al.

(10) Patent No.: US 12,482,765 B2
(45) Date of Patent: Nov. 25, 2025

(54) PACKAGING STRUCTURE AND MANUFACTURING METHOD THEREOF

(71) Applicant: JCET GROUP CO., LTD., Wuxi (CN)

(72) Inventors: Yaojian Lin, Wuxi (CN); Danfeng Yang, Wuxi (CN); Chen Xu, Wuxi (CN); Chenye He, Wuxi (CN)

(73) Assignee: JCET GROUP CO., LTD., Wuxi (CN)

( * ) Notice: Subject to any disclaimer, the term of this patent is extended or adjusted under 35 U.S.C. 154(b) by 432 days.

(21) Appl. No.: 18/015,324

(22) PCT Filed: May 19, 2021

(86) PCT No.: PCT/CN2021/094563
§ 371 (c)(1),
(2) Date: Jan. 9, 2023

(87) PCT Pub. No.: WO2022/007506
PCT Pub. Date: Jan. 13, 2022

(65) Prior Publication Data
US 2023/0275039 A1    Aug. 31, 2023

(30) Foreign Application Priority Data
Jul. 10, 2020 (CN) .......................... 202010663411.4

(51) Int. Cl.
*H01L 21/48* (2006.01)
*H01L 23/00* (2006.01)
(Continued)

(52) U.S. Cl.
CPC .......... *H01L 23/564* (2013.01); *H01L 21/486* (2013.01); *H01L 23/18* (2013.01); *H01L 23/49827* (2013.01)

(58) Field of Classification Search
None
See application file for complete search history.

(56) References Cited

U.S. PATENT DOCUMENTS 5,814,393 A * 9/1998 Miyaake ............. B32B 37/0007
  428/209
8,349,658 B2 * 1/2013 Chi ......................... H01L 24/20
  257/667

(Continued)

FOREIGN PATENT DOCUMENTS

CN    106328607 A    1/2017
CN    107622957 A    1/2018
(Continued)

*Primary Examiner* — Cory W Eskridge
(74) *Attorney, Agent, or Firm* — MUNCY, GEISSLER, OLDS & LOWE, P.C.

(57) ABSTRACT

The present invention provides a packaging structure and a manufacturing method thereof. The packaging structure includes an interposer, chips, and warpage adjustment structures, wherein the interposer includes a first surface and a second surface opposite thereto, and the chips are electrically connected to the first surface of the interposer; the warpage adjustment structures are symmetrically distributed with respect to a center of the first surface; and each of the warpage adjustment structures include a warpage adjustment piece and/or a cavity filled with a plastic packaging material, the warpage adjustment piece is disposed on the first surface, and the cavity is located outside conducting structures and sinks inward along the first surface. By cooperation between the warpage adjustment pieces and the cavities filled with the plastic packaging material, the warpage of the interposer in horizontal and vertical directions can be reduced.

16 Claims, 12 Drawing Sheets

(51) Int. Cl.
*H01L 23/18* (2006.01)
*H01L 23/498* (2006.01)

(56) References Cited

U.S. PATENT DOCUMENTS

| | | | |
|---|---|---|---|
| 10,535,608 B1 | 1/2020 | Rubin et al. | |
| 2005/0170561 A1* | 8/2005 | Huang | H01L 23/10 |
| | | | 438/114 |
| 2013/0003319 A1 | 1/2013 | Malaktar et al. | |
| 2014/0048951 A1* | 2/2014 | Lin | H01L 23/49827 |
| | | | 257/774 |
| 2015/0115433 A1* | 4/2015 | Lin | H01L 24/81 |
| | | | 438/122 |
| 2018/0350755 A1* | 12/2018 | Huang | H01L 23/3128 |
| 2019/0006341 A1* | 1/2019 | Lin | H01L 21/563 |
| 2020/0411448 A1* | 12/2020 | Goh | H01L 23/552 |
| 2022/0013475 A1* | 1/2022 | Kim | H01L 25/0652 |
| 2023/0125605 A1* | 4/2023 | Tanaka | H01L 21/6835 |
| | | | 257/432 |

FOREIGN PATENT DOCUMENTS

| | | |
|---|---|---|
| CN | 109216289 A | 1/2019 |
| CN | 208608194 U | 3/2019 |
| CN | 110676240 A | 1/2020 |

* cited by examiner

PACKAGING STRUCTURE AND MANUFACTURING METHOD THEREOF

CROSS REFERENCE TO RELATED APPLICATIONS

The present application is a 35 U.S.C. § 371 National Phase conversion of International (PCT) Patent Application No. PCT/CN2021/094563, filed on May 19, 2021, which claims the priority of Chinese Application No. 202010663411.4 filed on Jul. 10, 2020, the disclosure of which is incorporated by reference herein. The PCT International Patent Application was filed and published in Chinese.

TECHNICAL FIELD

The present invention relates to the field of packaging technologies, and in particular, to a packaging structure and a manufacturing method thereof.

BACKGROUND

At present, with the further development of electronic products towards integration, miniaturization, and intelligence, traditional chip packaging structures can no longer meet the development needs of electronic products. Implementing multifunction system on chip-level integrated packaging by means of an interposer (or so-called intermediary layer) has drawn more and more attention.

However, in a packaging structure using the interposer, due to a large difference between coefficients of thermal expansion of an interposer made of a silicon material and a plastic packaging material, warpage will be caused by different rates of expansion of the two in a manufacturing process, especially in a reflow soldering process. In particular, when a package body is relatively large while a chip is relatively small, or when the package body is relatively thin, the warpage problem becomes more obvious. Consequently, the reliability of the packaging structure is severely reduced by the serious warpage problem.

SUMMARY

An object of the present invention is to provide a packaging structure and a manufacturing method thereof.

The present invention provides a packaging structure, including an interposer and chips, the interposer including a first surface and a second surface opposite thereto, the interposer being internally provided with conducting structures communicating the first surface and the second surface, and the chips being electrically connected to the first surface of the interposer, wherein
  the packaging structure further includes a plurality of warpage adjustment structures, which are substantially symmetrically distributed with respect to a center of the first surface; and
  each warpage adjustment structure includes a warpage adjustment piece and/or a cavity filled with a plastic packaging material, the warpage adjustment piece being disposed on the first surface, and the cavity being located outside the conducting structure and sinking inward along first surface.

As a further improvement of the present invention, the warpage adjustment structures are distributed at four corners and/or four edges of the interposer.

As a further improvement of the present invention, when both the warpage adjustment pieces and the cavities are disposed, the warpage adjustment pieces and the cavities are spaced apart in distribution, or at least a portion of each of the warpage adjustment pieces is superimposed above the corresponding cavity.

As a further improvement of the present invention, when the warpage adjustment pieces are superimposed above the cavities, a bottom surface of each warpage adjustment piece is at least partially joined with the first surface adjacent to the cavity corresponding to the warpage adjustment piece, and a contact area between the bottom surface of each of the warpage adjustment pieces and the first surface is greater than an area of the bottom surface above an opening of the cavity.

As a further improvement of the present invention, the warpage adjustment pieces each have a laminated composite structure including a first filling layer and a second filling layer disposed above the first filling layer, a material used for the first filling layer is a polymer composite material or metal, and a material used for the second filling layer is silicon or metal.

As a further improvement of the present invention, a coefficient of thermal expansion of the material used for the first filling layer is greater than 5 ppm/K.

As a further improvement of the present invention, a thickness of the first filling layer is greater than a thickness of the second filling layer and a thickness of the interposer, respectively.

As a further improvement of the present invention, the interposer is further internally provided with a decoupling trench silicon-based capacitor, and/or an active circuit, and/or a passive circuit.

The present invention further provides a manufacturing method of a packaging structure. The method includes the steps of:
  providing a base material, forming conducting structures inside the base material, and forming a connecting line on a first surface of the base material;
  forming warpage adjustment structures in a region between adjacent interposers on the base material, including: manufacturing cavities and/or arranging warpage adjustment pieces, and bonding and connecting chips to the connecting line;
  performing plastic packaging on the chips; and
  thinning a back surface of the base material to expose the conducting structures, forming electrical contacts connected to the conducting structures, and cutting the base material to form individual package bodies.

As a further improvement of the present invention, positions of the warpage adjustment structures are substantially symmetrically distributed with respect to a center of a surface of each of the interposers.

As a further improvement of the present invention, when both the warpage adjustment pieces and the cavities are disposed, the warpage adjustment pieces and the cavities are spaced apart in distribution, or at least a portion of each of the warpage adjustment pieces is superimposed above the corresponding cavity.

As a further improvement of the present invention, when the warpage adjustment pieces are superimposed above the cavities, a bottom surface of each warpage adjustment piece is at least partially joined with the first surface adjacent to the cavity corresponding to the warpage adjustment piece, and a contact area between the bottom surface of the warpage adjustment piece and the first surface is greater than an area of the bottom surface above an opening of the cavity.

As a further improvement of the present invention, manufacturing the cavities specifically includes:
forming the cavities, sinking inward, in the region between the adjacent interposers on the base material; and
filling, when performing the plastic packaging on the chips, a plastic packaging material in the cavities at the same time.

As a further improvement of the present invention, arranging the warpage adjustment pieces specifically includes the steps of:
manufacturing the warpage adjustment pieces; and
connecting the warpage adjustment pieces to the region between the adjacent interposers on the base material by means of an adhesive layer or by metal bonding.

As a further improvement of the present invention, manufacturing the warpage adjustment pieces specifically includes the steps of:
providing a carrier plate;
forming a plurality of silicon slices or metal slices of uniform size by thinning and cutting; and
arranging the adhesive layer on the carrier plate, and connecting the silicon slices or metal slices equidistantly on the carrier plate by means of the adhesive layer;
filling a plastic packaging material to cover the silicon slices, or laminating a polymer composite material to cover the silicon slices or metal slices;
removing the carrier plate and the adhesive layer; and
cutting the plastic packaging material or the polymer composite material to form individual warpage adjustment pieces each having a double-layer structure.

As a further improvement of the present invention, manufacturing the warpage adjustment pieces specifically includes the steps of:
forming equidistantly distributed grooves in a first surface of a silicon slice or a metal slice;
filling a plastic packaging material or laminating a polymer composite material layer in the grooves and on the first surface of the silicon slice;
thinning a back surface of the silicon slice or metal slice to expose the grooves; and
cutting the plastic packaging material or the polymer composite material to form individual warpage adjustment pieces each having a double-layer structure.

As a further improvement of the present invention, after forming the individual adapter plates, the manufacturing method further includes the step of: bonding the package bodies onto a substrate.

The present invention has the following beneficial effects. On the one hand, in the present invention, the substantially symmetrically distributed cavities are formed at the edges of the interposer, and fills the cavities with the plastic packaging material, such that when the plastic packaging material having a large coefficient of thermal expansion in the cavities expand at high temperature, a reverse force is applied to the interposer in a horizontal direction, thereby counteracting a warpage force of the interposer to a certain extent to reduce the overall warpage of the package body. In addition, the plastic packaging materials in the cavities are better integrated with the underfill on the substrate to achieve high reliability.

On the other hand, in the present invention, the substantially symmetrically distributed warpage adjustment pieces, each having a double-layer structure, are further arranged on the interposer, such that the first filling layers having a large coefficient of thermal expansion, when expanding at high temperature, apply a reverse force to the interposer in a vertical direction, thereby suppressing warpage. In addition, the exposed back surface of each warpage adjustment piece is conducive to the combination of the package body and a thermal medium material, thereby improving the heat dissipation efficiency.

DETAILED DESCRIPTION

Figure 1:
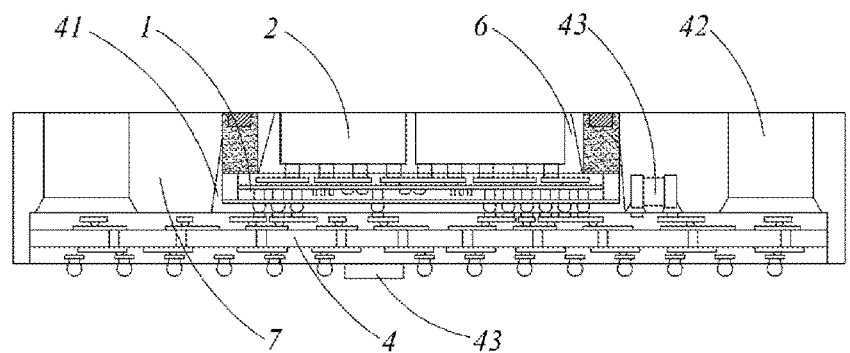
FIG. 1 is a schematic diagram of a packaging structure according to the present invention.

In order to make the objects, technical solutions, and advantages of the present application clearer, the technical solutions of the present application will be clearly and completely described below in conjunction with the specific embodiments of the present application and the corresponding accompanying drawings. Obviously, the described embodiments are only some of the embodiments of the present application, rather than all of the embodiments. Based on the embodiments in the present application, all other embodiments obtained by those of ordinary skill in the art without creative work shall fall within the protection scope of the present application.

The following describes the embodiments of the present invention in detail. Examples of the embodiments are shown in the accompanying drawings, in which the same or similar reference numerals indicate the same or similar elements or the elements with the same or similar functions throughout the Description. The following embodiments described with reference to the accompanying drawings are exemplary only for the purpose of explaining the present invention, and should not be understood as limiting the present invention.

For the convenience of description, the terms, such as "upper", "lower", "rear" and "front", representing the relative positions in space are used herein to describe the relationship of one unit or feature shown in the accompanying drawings relative to another unit or feature. The terms describing the relative positions in space may include different orientations of the equipment in use or in operation other than the orientations shown in the accompanying drawings. For example, if a device in the drawings is turned over, the unit described as being "below" or "above" other units or features will be positioned "above" or "below" the other units or features. Therefore, the exemplary term "below" can encompass the spatial orientations of both below and above.

As shown in FIG. 1, the present invention provides a substrate including a substrate 4, an interposer 1, and chips 2. The interposer 1 is disposed on the substrate 4, the chips 2 are disposed on the interposer 1, and the chips 2 and the substrate 4 are electrically conducted by means of the interposer 1.

In some other implementations of the present invention, the front or back surface of the substrate 4 is further provided with an additional optional structure such as a reinforcing rib 42, a decoupling capacitor 43, a passive component, and a heat sink. In some other implementations, the substrate 4 is further provided with an optional plastic packaging layer 7 disposed on the above structural members by plastic packaging, and the optional plastic packaging layer 7 may also be disposed on the side surface of the substrate 4 or provided with a protective coating to provide protection.

Figure 2:
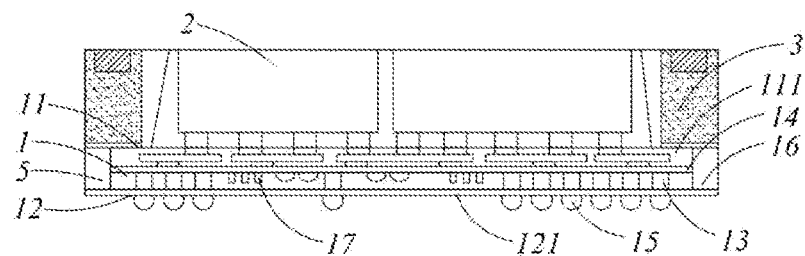
FIG. 2 is a schematic diagram showing an interposer, chips, and warpage adjustment structures in a packaging structure according to the present invention.

As shown in FIG. 2, the interposer 1 includes a first surface 11 and a second surface 12 opposite thereto, and the interposer 1 is internally provided with conducting structures 13 communicating the first surface 11 and the second surface 12.

The conducting structures 13 may be silicon through-holes each having an inner wall surface plated with and being filled with such as Ta, TaN, Cu, W, Ti, TiN or a composite material containing the above materials, or may be other structures, such as conductive polysilicon-filled silicon through-holes, as long as the first surface 11 and the second surface 12 can be electrically conducted.

The first surface 11 of the interposer 1 is provided with a connecting line layer 14, which is connected to the conducting structures 13.

The interposer 1 is made of silicon, germanium, gallium arsenide, indium phosphide, silicon carbide, gallium nitride and other silicon-based heterogeneous wafer materials.

Further, the chips 2 are electrically connected to the connecting line layer 14 on the first surface 11 by flip-mounting or heterogenous bonding. A primary underfill 6 is further optionally filled between the chips 2 and the interposer 1. The back surface of the interposer 1 is provided with electrical contacts 15, to which the chips 2 are electrically connected by means of the conducting structures 13.

The electric contacts 15 are solder balls each with a metal layer under the ball or composite structures each with a tin cap, such as a copper-nickel-silver tin structure.

In some implementations of the present invention, the interposer 1 is further provided thereon with a decoupling trench silicon-based capacitor 17, a transistor, a metal-insulator-metal capacitor, and other devices, and the second surface 12 is optionally provided with a second redistribution layer 121.

In some other implementations of the present invention, a first redistribution layer 111 is further disposed above the connecting line layer 14, and the first redistribution layer 111 and the second redistribution layer 121 are electrically connected by means of the conducting structures 13. The first redistribution layer 111 and the connecting line layer 14 may jointly form a thin-film integrated passive device structure, including an optional metal-insulator-metal capacitor, resistor, and inductor, in order to enhance the overall electrical performance of the device.

The packaging structure further includes a plurality of warpage adjustment structures, which are substantially symmetrically distributed with respect to the center of the first surface. The warpage adjustment structures include warpage adjustment pieces 3 and/or cavities 16 filled with a plastic packaging material; the warpage adjustment pieces 3 are disposed on the first surface; and the cavities 16 are located on the outer sides of the conducting structures 13 and sink inward along the first surface 11.

The chips 2, the interposer 1, the warpage adjustment structures, and the optional decoupling trench silicon-based capacitor 17 in the interposer or the optional passive element on the surface of the interposer form a primary package body. The primary package body is bonded to the substrate 4, and an optional secondary underfill 41 is filled between the primary package body and the base material. Plastic packaging is performed on the reinforcing rib 42, a primary plastic packaging body, and the surface decoupling capacitor 43 using the secondary plastic packaging material 41, with the chips 2 and the reinforcing rib 42 exposed.

In the present invention, the warpage adjustment pieces and the cavities have a variety of distribution patterns, which will be specifically described below according to different embodiments.

Figure 3:
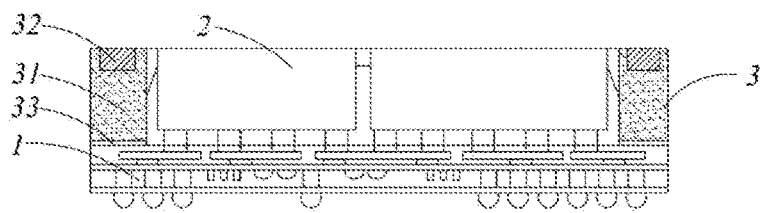
FIG. 3 is a schematic diagram showing an interposer, chips, and warpage adjustment pieces in a packaging structure according to Embodiment 1 of the present invention.

As shown in FIG. 3, in Embodiment 1 of the present invention, the side edges of the interposer 1 are provided with at least two warpage adjustment pieces 3, and the cavities 16 are not provided.

The warpage adjustment pieces 3 are fixed to the surface of the interposer 1 by means of an adhesive layer 33 or by metal bonding.

Further, the warpage adjustment pieces 3 each is of a laminated composite structure including a first filling layer 31 and a second filling layer 32 disposed above the first filling layer 31.

Specifically, a material used for each first filling layer 31 is a polymer composite material or metal, with a coefficient of thermal expansion being greater than 5 ppm/K. The use of a material having a large coefficient of thermal expansion as the first filling layer 31 allows, in a process such as reflow soldering, the material having the large coefficient of thermal expansion of the first filling layer 31 to expand at high temperature to apply a downward force to the interposer 1, which can counteract an upward warpage force of the interposer 1 to a certain extent, thereby reducing the overall warpage of the package body. The substantially centrosymmetric distribution of the warpage adjustment pieces 3 with respect to the center of the first surface 11 allows the application of a balanced force throughout the interposer 1, whereby warpage aggravation caused by the application of an imbalanced force is avoided.

A material used for each second filling layer 32 is silicon. A silicon slice is disposed above each first filling layer 31, whereby, by exposing an upper surface of the silicon slice to air, the heat dissipation in a region covered by the warpage adjustment piece 3 can be enhanced on the one hand, and by arranging the silicon slice in the warpage adjustment piece 3, the stiffness of the packaging structure can be improved on the other hand.

Preferably, the thickness of each first filling layer 31 is greater than the thickness of each first filling layer 31 and the thickness of the interposer 1, such that each first filling layer 31 can produce a larger expansion volume to enhance the suppression effect on warpage.

The size of each warpage adjustment piece 3 may be adaptively adjusted according to the size of a region of the interposer 1 not covered by the chips 2, in order to maximize the suppression effect on the warpage of the warpage adjustment piece 3.

With the warpage adjustment pieces 3 disposed at the corners or edges of the interposer 1, the warpage adjustment pieces 3 may be disposed either at junction edges of two adjacent interposers 1 on a base material wafer, or at junction corners of four adjacent interposers 1; and dicing channels are arranged on the warpage adjustment pieces 3, such that, after the individual interposers 1 are cut from the base material, the warpage adjustment pieces 3 can be disposed on the plurality of interposers 1 at the same time by arranging the warpage adjustment pieces 3 in one step and cooperating with the cutting process, which simplifies a technological process.

On the other hand, with the warpage adjustment pieces 3 arranged at the corners or edges, a larger torque can be provided to the interposer 1 when the first filling layers 31 undergo thermal expansion, such that the suppression effect on warpage is improved.

According to the structure of each warpage adjustment pieces 3 before cutting, the side edge of the second filling layer 32 of each warpage adjustment piece 3 disposed on the individual interposer 1 may be either exposed to the side surface of the interposer, or covered by the first filling layer 31.

Specifically, the warpage adjustment pieces 3 in Embodiment 1 have a variety of arrangement modes, and some of the preferred arrangement modes are specifically described below.

It should be noted that the arrangement modes of the warpage adjustment pieces 3 may be adaptively adjusted according to the different numbers and sizes of the chips 2 on the interposer 1.

Figure 4:
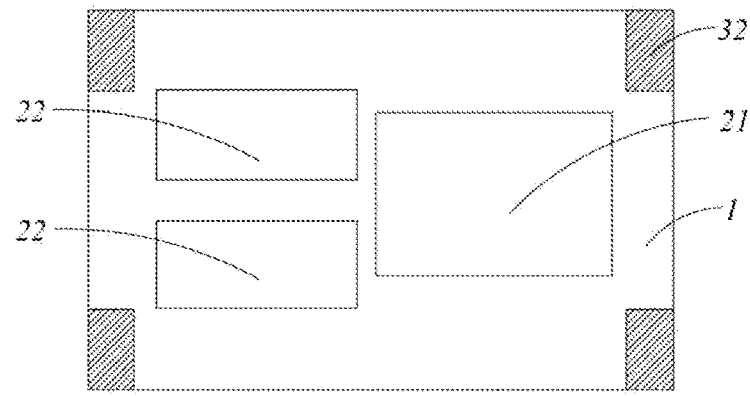
FIG. 4 to FIG. 10 are schematic diagrams showing different distribution positions of the warpage adjustment pieces according to Embodiment 1 of the present invention.

As shown in FIG. 4, the warpage adjustment pieces 3 have the same shape and are located at four corners of the interposer 1, respectively, and four side edges of each second filling layer 32 are all exposed to the side surface of the interposer.

Here, the number of chips 2 is three, including a large chip 21 and two small chips 22 on one side of the large chip, and the spacing between the two small chips 22 is at least 1.2 times the distance between each small chip and the large chip 21, in order to adjust the stress.

Figure 5:
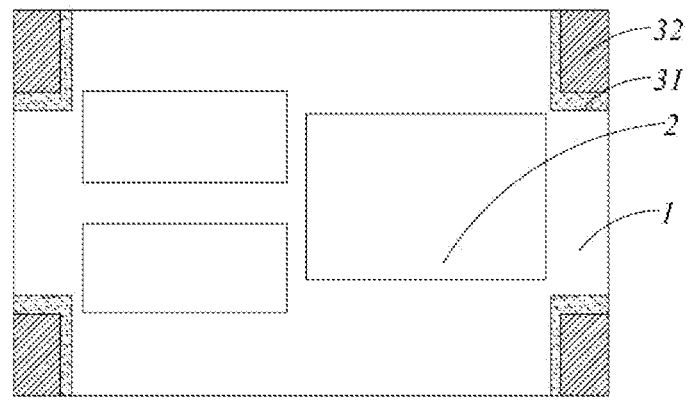

As shown in FIG. 5, the warpage adjustment pieces 3 have the same shape and are located at four corners of the interposer 1, respectively, and two side edges of each second filling layer 32 are exposed to the side surface of the interposer.

Figure 6:
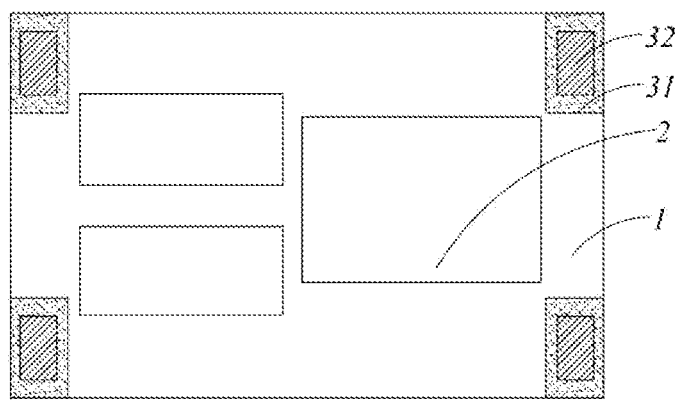

As shown in FIG. 6, the warpage adjustment pieces 3 have the same shape and are located at four corners of the interposer 1, respectively, and side edges of each second filling layer 32 are covered by the corresponding first filling layer 31.

Figure 7:
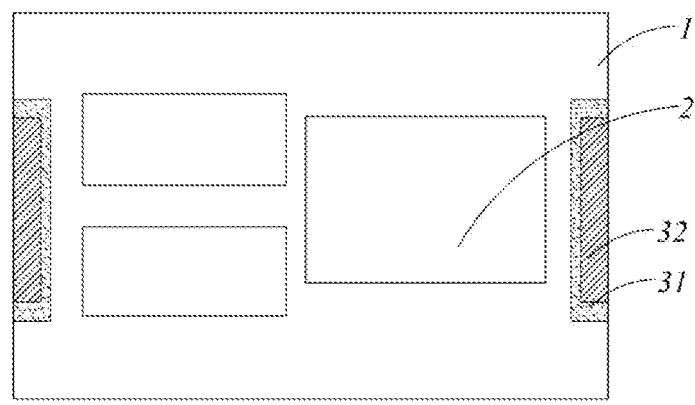

As shown in FIG. 7, the warpage adjustment pieces 3 have the same shape and are located at two opposite edges of the interposer 1, respectively, and two side edges of each second filling layer 32 are exposed to the side surface of the interposer.

Figure 8:
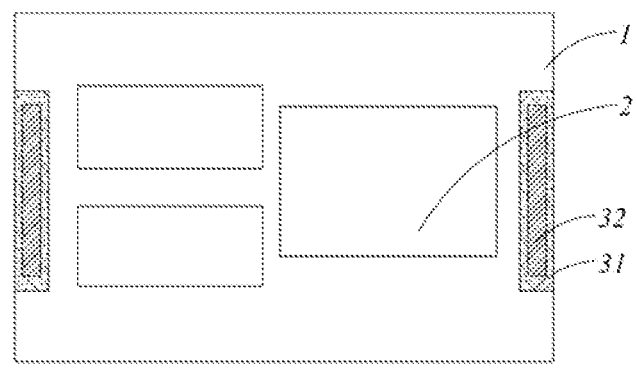

As shown in FIG. 8, the warpage adjustment pieces 3 have the same shape and are located at two opposite edges of the interposer 1, respectively, and side edges of each second filling layer 32 are covered by the corresponding first filling layer 31.

Figure 9:
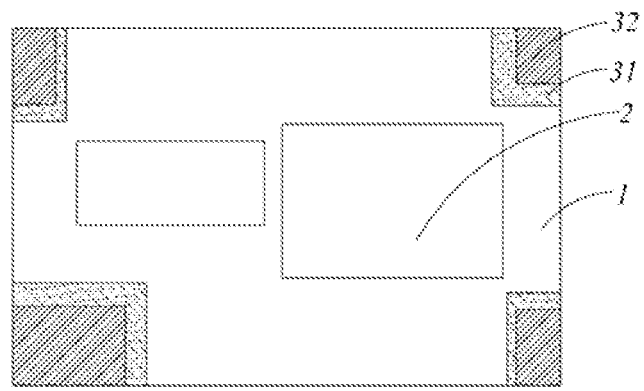

As shown in FIG. 9, the warpage adjustment pieces 3 are located at four corners of the interposer 1, respectively, where the warpage adjustment piece 3 located in the region of the interposer 1 uncovered by the chips 2 has a larger volume; and two side edges of each second filling layer 32 are exposed to the side surface of the interposer.

Figure 10:
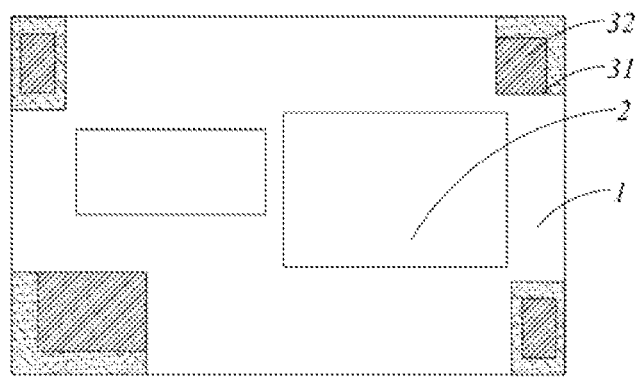

As shown in FIG. 10, the warpage adjustment pieces 3 are located at four corners of the interposer 1, respectively, where the warpage adjustment piece 3 located in the region of the interposer 1 uncovered by the chips 2 has a larger volume; and side edges of each second filling layer 32 are covered by the corresponding first filling layer 31.

Figure 11:
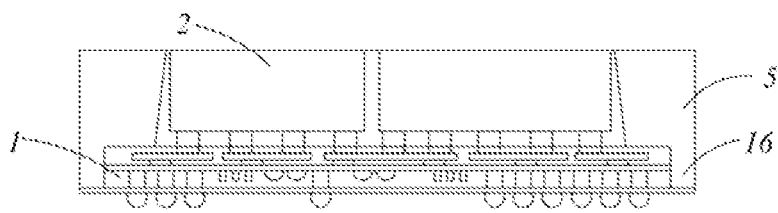
FIG. 11 is a schematic diagram showing an interposer, chips, and cavities in a packaging structure according to Embodiment 2 of the present invention.

As shown in FIG. 11, a packaging structure is provided according to Embodiment 2 of the present invention, in which, compared to Embodiment 1, the side edges of the interposer 1 are provided with at least two cavities 16 sinking inward along the first surface 11, the warpage adjustment pieces 3 are not disposed, and the cavities 16 are disposed outside the conducting structures 13.

Further, the cavities 16 are each filled with a plastic packaging material 5.

Here, the cavities 16 are disposed in the interposer 1, and filled with the plastic packaging material 5, such that, in a technological process such as reflow soldering, the plastic packaging material 5 having a large coefficient of thermal expansion in the cavities 16 expands at a high temperature to apply a reverse force to the interposer 1 in a horizontal direction, thereby suppressing the warpage of the interposer 1 in the horizontal direction.

With the cavities 16 disposed in the corners or edges of the interposer 1, the cavities 16 may be manufactured at the junction edges of two adjacent interposers 1 on a base material water, or at junction corners of four adjacent interposers 1, and dicing channels are arranged in the cavities 16, such that, after the individual interposers 1 are cut from the base material, the cavities 16 can be formed in the plurality of interposers 1 by a primary cavity manufacturing process, which simplifies a technological process.

Preferably, the opening positions of the cavities 16 are substantially symmetrically distributed with respect to the center of the first surface 11.

The cavities 16 in a symmetrical layout can apply a balanced force throughout the interposer 1 to better suppress the warpage, and can avoid warpage aggravation caused by the application of an imbalanced force.

The depth of each cavity 16 is not specifically limited and may be adjusted according to the sizes and structures of the interposer 1 and the chips 2, in such a way that an optimal effect of warpage suppression is achieved.

The shape of each cavity 16 is a square, or a rectangle, or a chamfered square, or a chamfered rectangle, or a right-angled fan.

Specifically, the cavities 16 in Embodiment 2 have a variety of arrangement modes, and some of the preferred arrangement modes are specifically described below.

Figure 12:
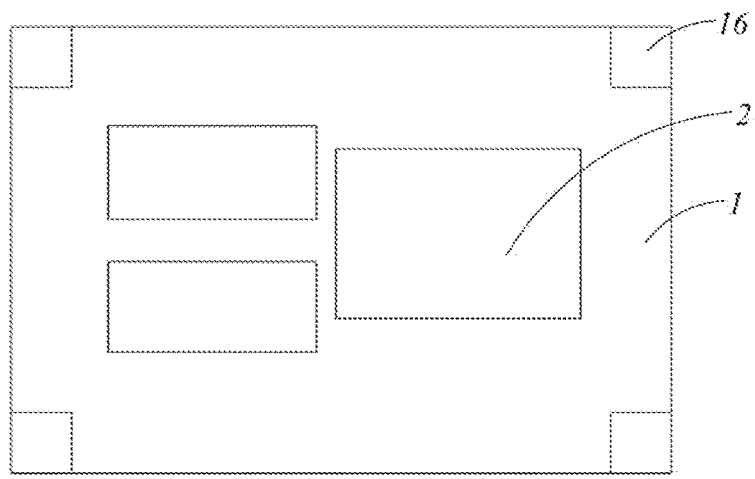
FIG. 12 to FIG. 15 are schematic diagrams showing different distribution positions of the cavities according to Embodiment 2 of the present invention.

As shown in FIG. 12, the cavities 16 are square grooves located at the four corners of the interposer 1, respectively.

Figure 13:
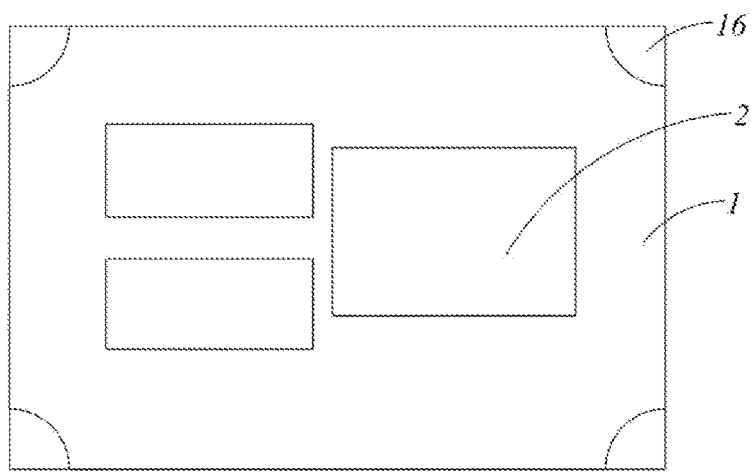

As shown in FIG. 13, the cavities 16 are right-angle fan-shaped grooves located at the four corners of the interposer 1, respectively.

Figure 14:
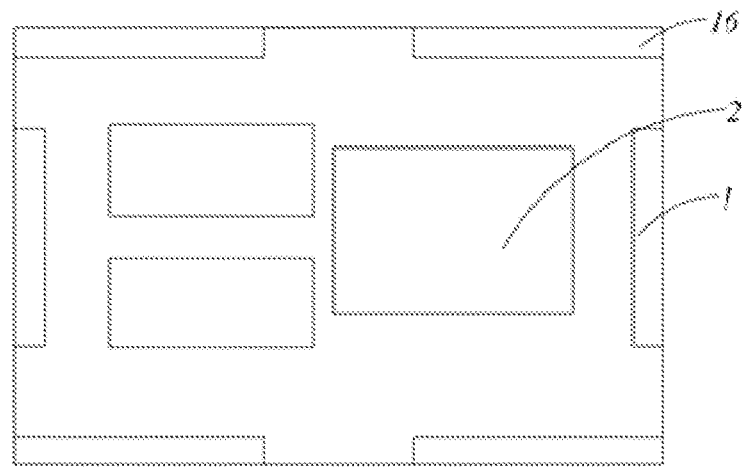

As shown in FIG. 14, the cavities 16 are rectangular grooves having a large aspect ratio, with four cavities located at four corners and extending inward along a pair of opposing edges, respectively, and with another two cavities 16 disposed on another two edges and each extending to both ends along the middle of the corresponding edge.

Figure 15:
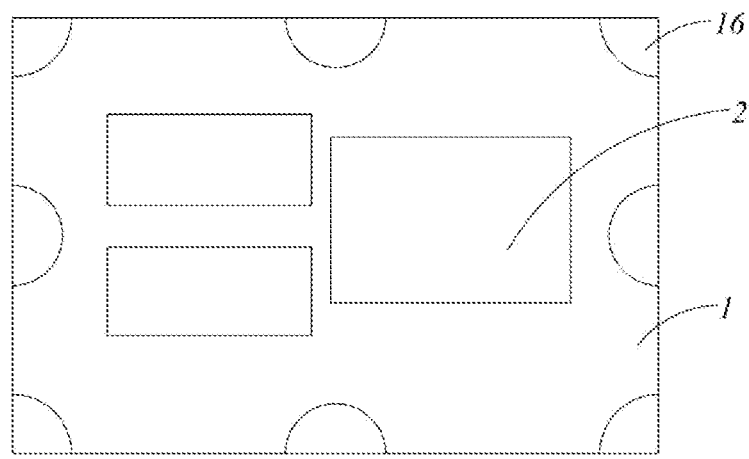

As shown in FIG. 15, the cavities 16 are right-angle fan-shaped grooves and semicircular grooves, with the right-angle fan-shaped cavities 16 located at the four corners of the interposer 1, respectively, and with the semicircular cavities 16 located in the middles of the four edges of the interposer 1, respectively.

Figure 16:
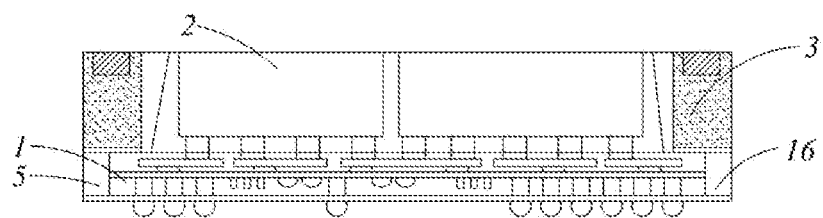
FIG. 16 is a schematic diagram showing an interposer, chips, warpage adjustment pieces, and cavities in a packaging structure according to Embodiment 3 of the present invention.

As shown in FIG. 16, a packaging structure is provided according to Embodiment 3 of the present invention, and differs from that in Embodiment 1 in that: the packaging structure is provided with both the cavities 16 and the warpage adjustment pieces 3, and the cavities 16 and the warpage adjustment pieces 3 are disposed on the side edges of the interposer 1, and are substantially symmetrically distributed with respect to the center of the first surface 11.

The provided cavities 16 and warpage adjustment pieces 3 can suppress the warpage of the interposer 1 in the horizontal and vertical directions at the same time.

The cavities 16 and the warpage adjustment pieces 3 are spaced apart and alternately distributed along the side edges of the first surface 11.

Specifically, the cavities 16 and the warpage adjustment pieces 3 in Embodiment 3 have a variety of arrangement modes, and some of the preferred arrangement modes are now specifically described below.

Figure 17:
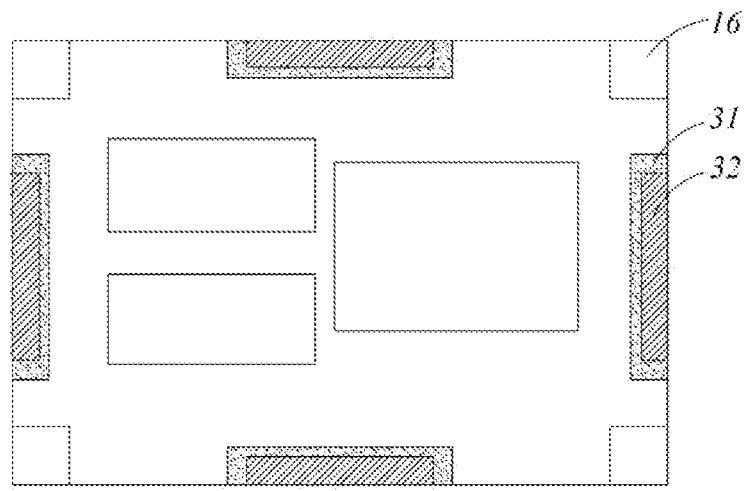
FIGS. 17 and 18 are schematic diagrams showing different distribution positions of the warpage adjustment pieces and cavities according to Embodiment 3 of the present invention.

As shown in FIG. 17, the cavities 16 are located at four corners of the interposer 1, respectively, and the warpage adjustment pieces 3 are located on four edges of the interposer 1.

Figure 18:
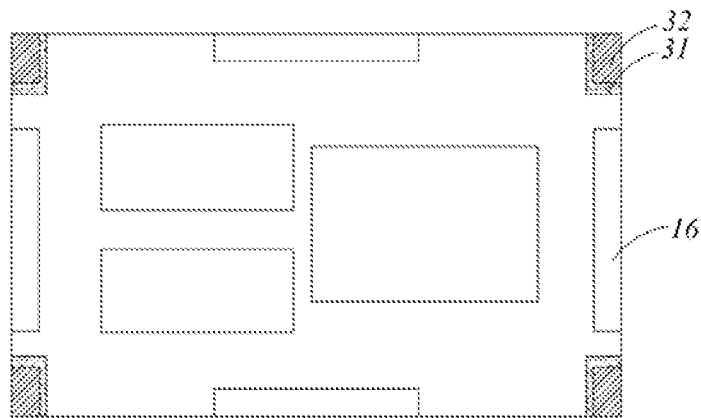

As shown in FIG. 18, the cavities 16 are located on four side edges of the interposer 1, respectively, and the warpage adjustment pieces 3 are located at four corners of the interposer 1.

In some other implementations of this embodiment, the warpage adjustment pieces 3 may also be superimposed above the cavities 16; the bottom surface of each warpage adjustment piece 3 is at least partially joined with the first surface 11 adjacent to the cavity 16 corresponding to the warpage adjustment piece, and a contact area between the bottom surface of the warpage adjustment piece 3 and the first surface 11 is greater than an area of the bottom surface above an opening of the cavity 16.

It can be understood that the warpage adjustment pieces 3 may also have no contact with the cavities 16.

Preferably, the superimposed area between each of the warpage adjustment pieces 3 and the corresponding cavity 16 in the horizontal direction is less than 30% of the area of the bottom surface of the warpage adjustment piece 3.

By limiting the superimposed area between each of the warpage adjustment pieces 3 and the corresponding cavity 16, the stability of a bonding structure between the warpage adjustment piece 3 and the interposer 1 can be guaranteed, and the effective exertion of the warpage suppression effect by the warpage adjustment piece 3 can be guaranteed.

Figure 19:
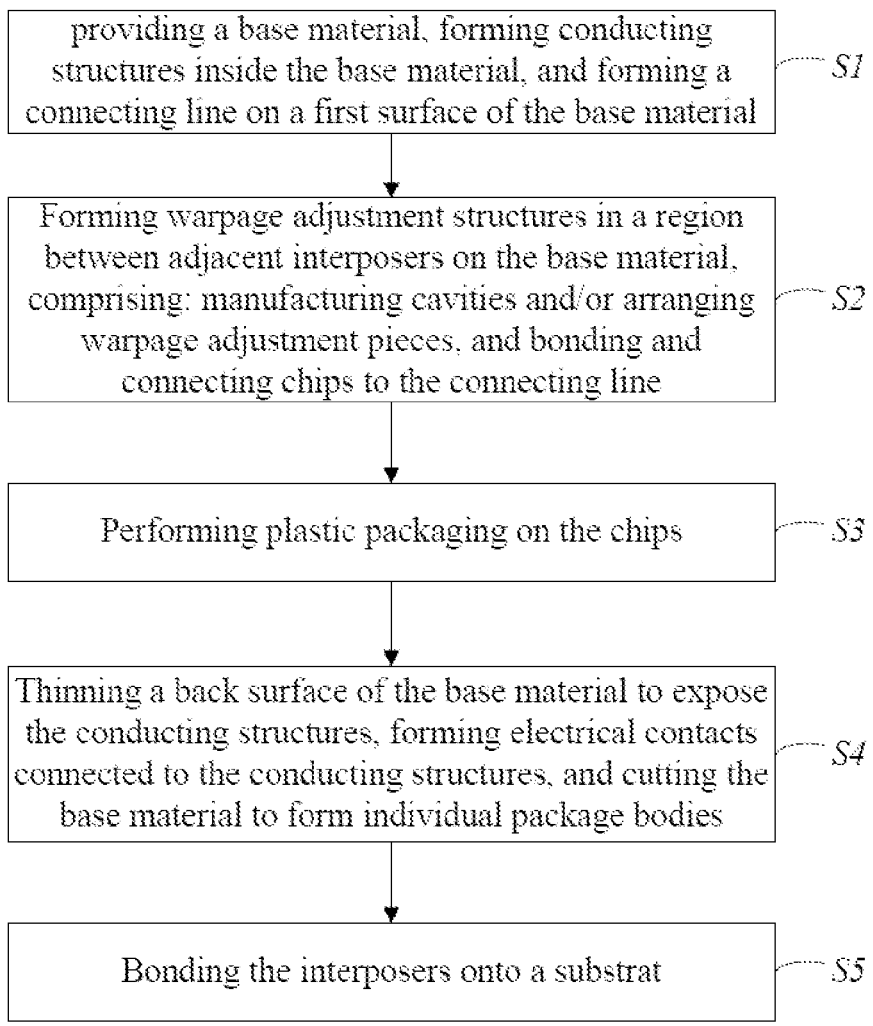
FIG. 19 is a schematic flowchart of a manufacturing method of a packaging structure according to the present invention.

As shown in FIG. 19, the present invention further provides a manufacturing method of a packaging structure. The manufacturing method includes the following steps.

Figure 20:
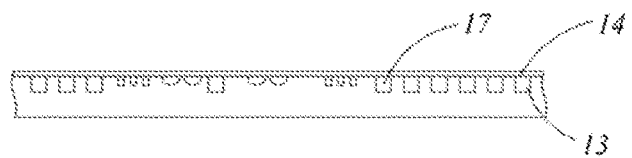
FIG. 20 to FIG. 24 are schematic diagrams of respective steps in an implementation of the manufacturing method of the packaging structure according to the present invention.

In S1, as shown in FIG. 20, a base material is provided, conducting structures 13 are formed inside the base material, and a connecting line layer 14 is formed on a first surface of the base material.

The conducting structures 13 may be silicon through-holes each with an inner wall surface plated with a metal conductive layer, or may be other structures.

Optionally, in some other implementations of the present invention, the base material may also be provided with a structure or component such as a decoupling trench silicon-based capacitor 17, a transistor, a metal-insulator-metal capacitor, and a redistribution layer.

Figure 21:
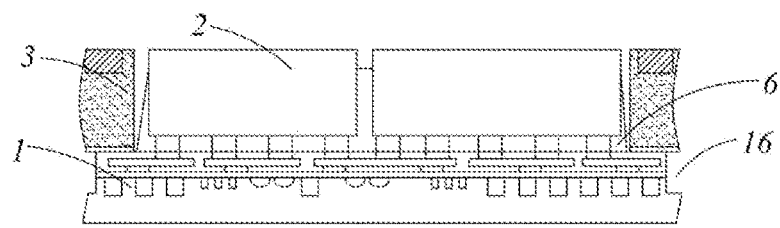

In S2, as shown in FIG. 21, warpage adjustment structures are formed in a region between adjacent interposers on the base material. This step includes: manufacturing cavities and/or arranging warpage adjustment pieces, and bonding and connecting chips 2 to a connecting line.

Further, the chips 2 are electrically connected to the connecting line layer 14 by flip-mounting or heterogenous bonding. A primary underfill 6 is further optionally filled between the chips 2 and the interposer 1.

Figure 22:
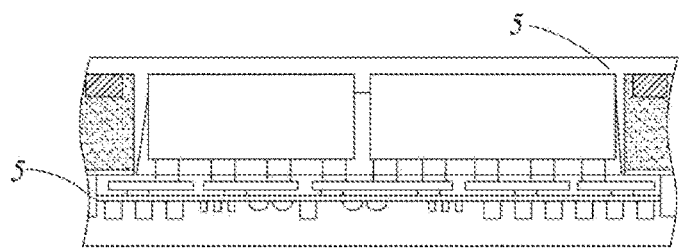

In S3, as shown in FIG. 22, plastic packaging is performed on the chips 2 with a plastic packaging material 5.

Figure 23:
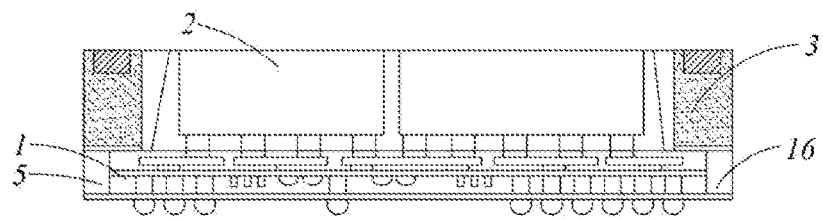

In S4, as shown in FIG. 23, a back surface of the base material is thinned to expose the conducting structures 13, electrical contacts 15 connected to the conducting structures 13 are formed, the plastic packaging material 5 is thinned, and the base material is cut to form individual package body structures.

Figure 24:
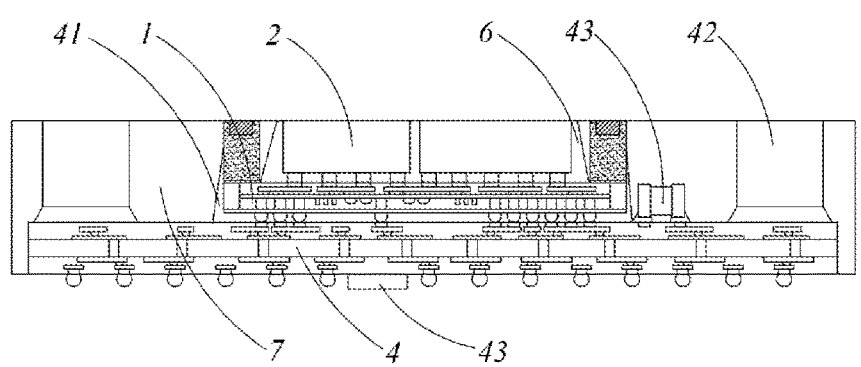

In S5, as shown in FIG. 24, the package body structures containing the interposers 1 are bonded onto the substrate 4, and a secondary underfill 41 is filled between the package body structures and the substrate 4.

Optionally, in some other implementations of the present invention, the front or back surface of the substrate 4 is also provided with an additional optional structure such as a decoupling capacitor 43, a reinforcing rib 42, a passive component, and a heat sink; and the substrate 4 may also be filled with an optional plastic packaging layer 7 disposed on the above structural members by plastic packing, and this optional plastic packaging layer 7 may also be disposed on the side surface of the substrate 4 or additionally provided with a protective coating.

Figure 25:
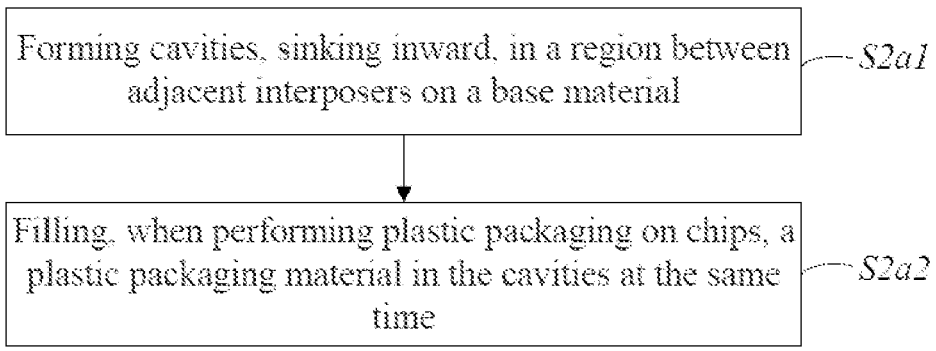
FIG. 25 is a schematic flowchart of manufacturing cavities according to the present invention.

As shown in FIG. 25, in some implementations of the present invention, manufacturing the cavities 16 specifically includes the following steps.

In S2*a*1, the cavities, sinking inward, are formed in the region between the adjacent interposers on the base material.

Specifically, the upper surface of the base material may be machined by laser, or mechanical grinding, or cutting grinding, or a selective dry method, or wet etching, etc. to manufacture the cavity 16.

Preferably, the opening positions of the cavities 16 are substantially symmetrically distributed with respect to the center of the interposer 1.

In some implementations of the present invention, the cavities 16 may also be prepared after the bonding of the chips 2 and the filling of the underfill.

In S2a2, when plastic packaging is performed on the chips 2, the plastic packaging material 5 is filled in the cavities 16 at the same time.

Figure 26:
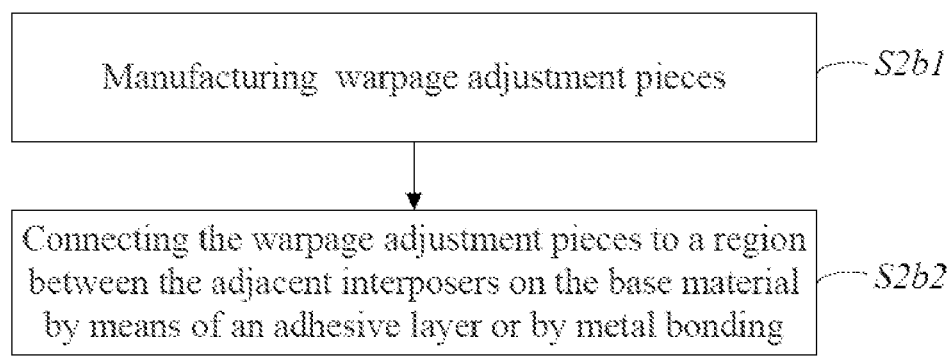
FIG. 26 is a schematic flowchart of arranging warpage adjustment pieces according to the present invention.

As shown in FIG. 26, in some implementations of the present invention, arranging the warpage adjustment pieces 3 includes the following steps.

In S2b1, the warpage adjustment pieces are manufactured.

In S2b2, the warpage adjustment pieces are connected to the region between the adjacent interposers on the base material by means of an adhesive layer or by metal bonding.

Further, when both the warpage adjustment pieces 3 and the cavities 16 are arranged, the warpage adjustment pieces 3 and the cavities 16 are spaced apart in distribution, or at least a portion of each of the warpage adjustment pieces 3 is superimposed above the corresponding cavity 16.

When the warpage adjustment pieces 3 are superimposed above the cavities 16, the bottom surface of each warpage adjustment piece 3 is at least partially joined with the first surface adjacent to the cavity 16 corresponding to the warpage adjustment piece, and a contact area between the bottom surface of the warpage adjustment piece 3 and the first surface is greater than an area of the bottom surface above an opening of the cavity 16.

Specifically, the warpage adjustment pieces 3 can be manufactured by a variety of methods, and two types of processes of manufacturing the warpage adjustment pieces 3 are specifically described below.

Figure 27:
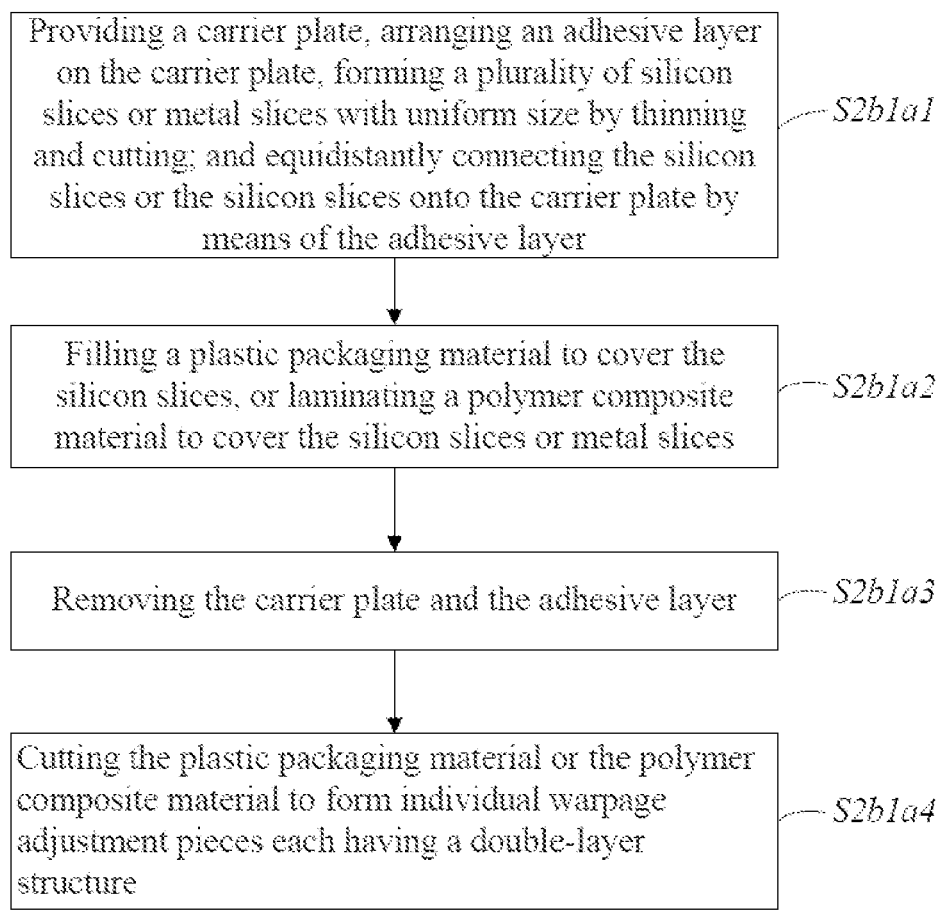
FIG. 27 is a first schematic flowchart of a manufacturing method of warpage adjustment pieces according to the present invention.

FIG. 27 shows a first process flow including the steps as follows.

Figure 28:
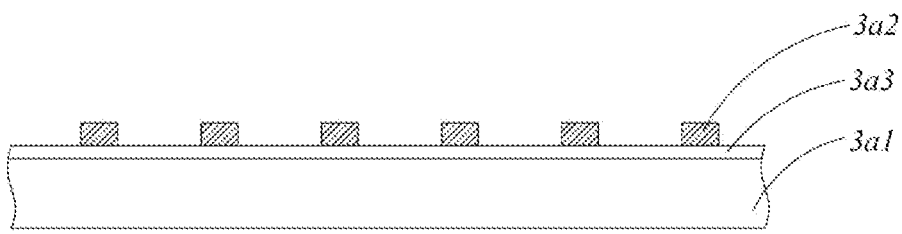
FIG. 28 to FIG. 31 are schematic diagrams of respective steps in the first schematic flowchart of the manufacturing method of the warpage adjustment pieces according to the present invention.

In S2b1a1, as shown in FIG. 28, a carrier plate 3a1 is provided; an adhesive layer is disposed on the carrier plate; a plurality of silicon slices 3a2 with uniform size are formed by thinning and cutting; and the silicon slices 3a2 are equidistantly connected onto the carrier plate by means of the adhesive layer 3a3. In some other implementations of the present invention, the silicon slices 3a2 may be replaced by metal slices.

Figure 29:
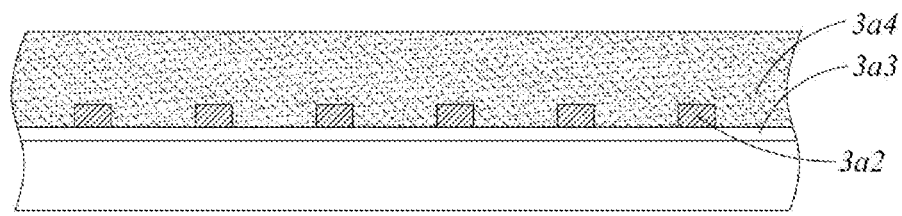

In S2b1a2, as shown in FIG. 29, a plastic packaging material 3a4 is filled to cover the silicon slices 3a2, or a polymer composite material is laminated to cover the silicon slices 3a2.

Figure 30:
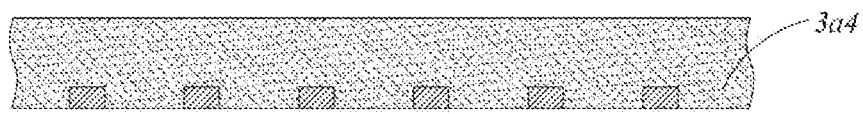

In S2b1a3, as shown in FIG. 30, the carrier plate 3a1 and the adhesive layer 3a3 are removed.

Figure 31:
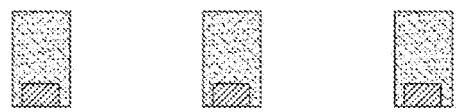

In S2b1a4, as shown in FIG. 31, the plastic packaging material or the polymer composite material is cut to form individual warpage adjustment pieces 3 each having a double-layer structure.

Figure 32:
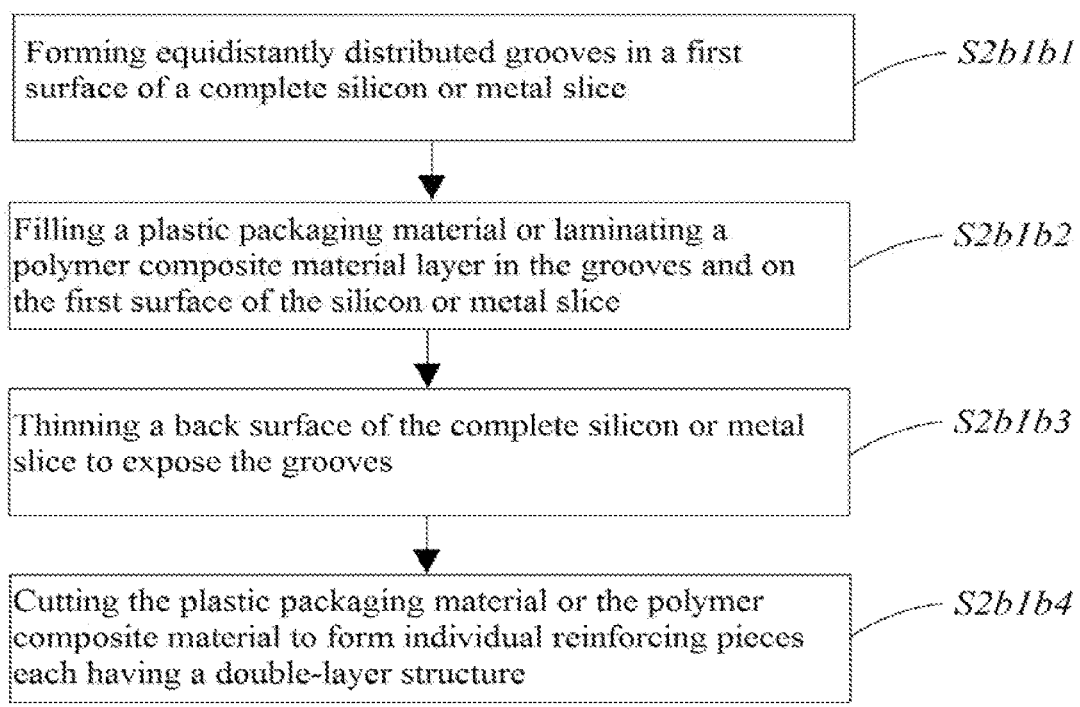
FIG. 32 is a second schematic flowchart of a manufacturing method of warpage adjustment pieces according to the present invention.

FIG. 32 shows a second process flow including the steps as follows.

Figure 33:
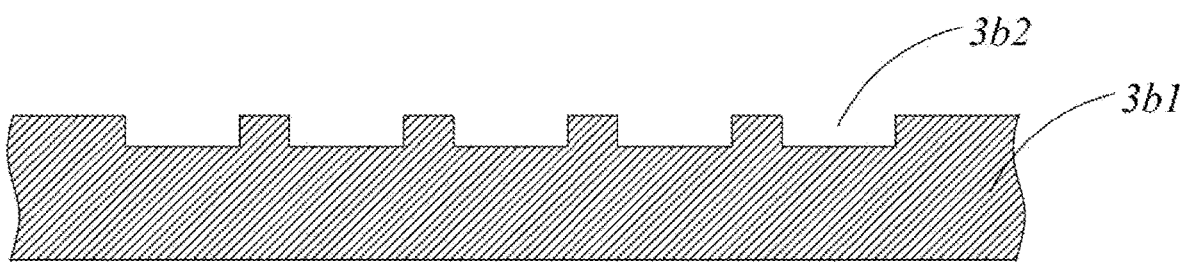
FIG. 33 to FIG. 36 are schematic diagrams of respective steps in the second schematic flowchart of the manufacturing method of the warpage adjustment pieces according to the present invention.

In S2b1b1, as shown in FIG. 33, equidistantly distributed grooves 3b2 are formed in a first surface of a complete silicon slice 3b1.

In some other implementations of the present invention, the complete silicon slice 3b1 may be replaced by a metal slice.

Figure 34:
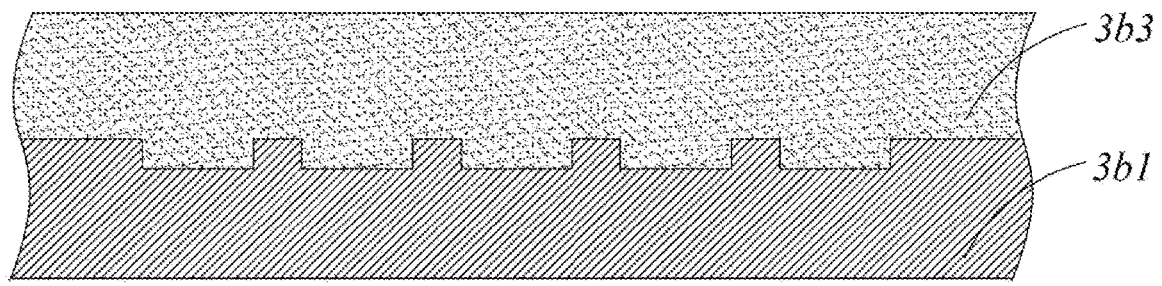

In S2b1b2, as shown in FIG. 34, a plastic packaging material 3b3 is filled or a polymer composite material layer is laminated in the grooves and on the first surface of the complete silicon slice 3b1.

Figure 35:
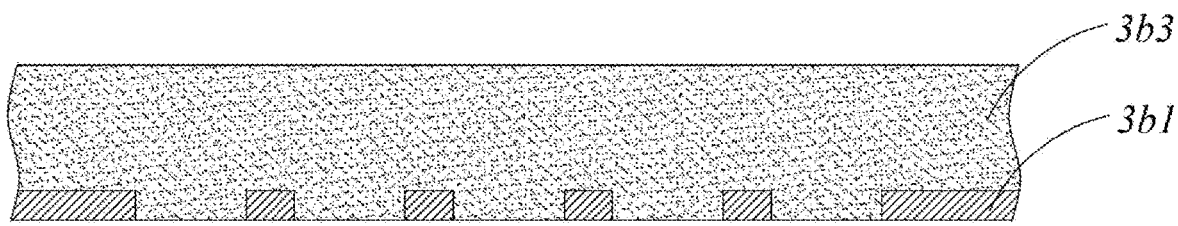

In S2b1b3, as shown in FIG. 35, a back surface of the complete silicon slice 3b1 is thinned to expose the grooves 3b2.

Figure 36:

In S2b1b4, as shown in FIG. 36, the plastic packaging material 3b3 or the polymer composite material is cut, to form the individual warpage adjustment pieces 3 each having a double-layer structure.

In summary, on the one hand, in the present invention, the substantially symmetrically distributed cavities are arranged on the edges of the interposer, and are filled with the plastic packaging material, such that when the plastic packaging material having a large coefficient of thermal expansion in the cavities expands at high temperature, a reverse force is applied to the interposer in a horizontal direction, thereby counteracting a warpage force of the interposer to a certain extent to reduce the overall warpage of the package body. In addition, the plastic packaging material in the cavities are better integrated with the underfill on the substrate to achieve high reliability.

On the other hand, in the present invention, the substantially symmetrically distributed warpage adjustment pieces, each having a double-layer structure, are further arranged on the interposer, such that the first filling layers having a large coefficient of thermal expansion, when expanding at high temperature, apply a reverse force to the interposer in a vertical direction, thereby also achieving the effect of suppressing warpage. In addition, the exposed back surface of each warpage adjustment piece is conducive to the combination of the package body and a thermal dielectric; material, thereby improving the heat dissipation efficiency.

It is to be understood that although the present invention is described in terms of embodiments in this Description, each of the embodiments is not intended to contain an independent technical solution. Such description manner of the Description is merely intended for clarity, and those skilled in the art should regard the description as a whole. The technical solutions in various embodiments may also be combined properly to develop other embodiments that can be understood by those skilled in the art.

The series of detailed descriptions listed above are merely for specifically illustrating the feasible embodiments of the present invention, but not intended to limit the protection scope of the present invention. Any equivalent embodiments or variations made without departing from the technical spirit of the present invention shall fall within the protection scope of the present invention.

What is claimed is:

1. A packaging structure, comprising an interposer and chips, the interposer comprising a first surface and a second surface opposite thereto, the interposer being internally provided with conducting structures communicating the first surface and the second surface, and the chips being electrically connected to the first surface of the interposer, wherein:
the packaging structure further comprises a plurality of warpage adjustment structures which are substantially symmetrically distributed with respect to a center of the first surface; and
each warpage adjustment structure comprises a warpage adjustment piece and a cavity filled with a plastic packaging material, or each warpage adjustment structure comprises a cavity filled with a plastic packaging material, the warpage adjustment piece being disposed on the first surface, and the cavity being located outside the conducting structure and sinking inward along the first surface.

2. The packaging structure according to claim 1, wherein the warpage adjustment structures are distributed at four corners and/or four edges of the interposer.

3. The packaging structure according to claim 2, wherein when both the warpage adjustment pieces and the cavities are disposed, the warpage adjustment pieces and the cavities are spaced apart in distribution, or at least a portion of each of the warpage adjustment pieces is superimposed above the corresponding cavity.

4. The packaging structure according to claim 3, wherein when the warpage adjustment pieces are superimposed above the cavities, a bottom surface of each warpage adjustment piece is at least partially joined with the first surface adjacent to the cavity corresponding to the warpage adjustment piece, and a contact area between the bottom surface of the warpage adjustment piece and the first surface is greater than an area of the bottom surface above an opening of the cavity.

5. The packaging structure according to claim 1, wherein the warpage adjustment pieces each have a laminated composite structure comprising a first filling layer and a second filling layer disposed above the first filling layer, a material used for the first filling layer is a polymer composite material or metal, and a material used for the second filling layer is silicon or metal.

6. The packaging structure according to claim 5, wherein a coefficient of thermal expansion of the material used for the first filling layer is greater than 5 ppm/K.

7. The packaging structure according to claim 5, wherein a thickness of the first filling layer is greater than a thickness of the second filling layer and a thickness of the interposer.

8. The packaging structure according to claim 1, wherein the interposer is further internally provided with one or more of a decoupling trench silicon-based capacitor, a transistor, a metal-insulator-metal capacitor, and a redistribution layer.

9. A manufacturing method of a packaging structure, comprising the steps of:
  providing a base material, forming conducting structures inside the base material, and forming a connecting line on a first surface of the base material;
  forming warpage adjustment structures in a region between adjacent interposers on the base material, comprising: manufacturing cavities and arranging warpage adjustment pieces, or manufacturing a cavity, and bonding and connecting chips to the connecting line;
  performing plastic packaging on the chips; and
  thinning a back surface of the base material to expose the conducting structures, forming electrical contacts connected to the conducting structures, and cutting the base material to form individual package bodies;
  manufacturing the cavities specifically comprises:
  forming the cavities, sinking inward, in the region between the adjacent interposers on the base material; and
  filling, when performing the plastic packaging on the chips, a plastic packaging material in the cavities at the same time.

10. The manufacturing method of the packaging structure according to claim 9, wherein positions of the warpage adjustment structures are substantially symmetrically distributed with respect to a center of a surface of each of the interposers.

11. The manufacturing method of the packaging structure according to claim 9, wherein when both the warpage adjustment pieces and the cavities are disposed, the warpage adjustment pieces and the cavities are spaced apart in distribution, or at least a portion of each of the warpage adjustment pieces is superimposed above the corresponding cavity.

12. The manufacturing method of the packaging structure according to claim 9, wherein when the warpage adjustment pieces are superimposed above the cavities, a bottom surface of each warpage adjustment piece is at least partially joined with the first surface adjacent to the cavity corresponding to the warpage adjustment piece, and a contact area between the bottom surface of the warpage adjustment piece and the first surface is greater than an area of the bottom surface above an opening of the cavity.

13. The manufacturing method of the packaging structure according to claim 9, wherein arranging the warpage adjustment pieces specifically comprises the steps of:
  manufacturing the warpage adjustment pieces; and
  connecting the warpage adjustment pieces to the region between the adjacent interposers on the base material by means of an adhesive layer or by metal bonding.

14. The manufacturing method of the packaging structure according to claim 13, wherein manufacturing the warpage adjustment pieces specifically comprises the steps of:
  providing a carrier plate;
  forming a plurality of silicon slices or metal slices of uniform size by thinning and cutting; and
  arranging the adhesive layer on the carrier plate, and connecting the silicon slices or metal slices equidistantly on the carrier plate by means of the adhesive layer;
  filling a plastic packaging material to cover the silicon slices, or laminating a polymer composite material to cover the silicon slices or metal slices;
  removing the carrier plate and the adhesive layer; and
  cutting the plastic packaging material or the polymer composite material to form individual warpage adjustment pieces each having a double-layer structure.

15. The manufacturing method of the packaging structure according to claim 13, wherein manufacturing the warpage adjustment pieces specifically comprises the steps of:
  forming equidistantly distributed grooves in a first surface of a silicon slice or metal slice;
  filling a plastic packaging material or laminating a polymer composite material layer in the grooves and on the first surface of the silicon slice;
  thinning a back surface of the silicon slice or metal slice to expose the grooves; and
  cutting the plastic packaging material or the polymer composite material to form individual warpage adjustment pieces each having a double-layer structure.

16. The manufacturing method of the packaging structure according to claim 9, wherein after forming the individual adapter plates, the manufacturing method further comprises the step of: bonding the package bodies onto a substrate.

\* \* \* \* \*